(12) United States Patent
Kuroda et al.

(10) Patent No.: US 7,109,053 B2
(45) Date of Patent: Sep. 19, 2006

(54) METHOD FOR PREPARING OPTICAL DEVICE BY DICING

(75) Inventors: Toshihiro Kuroda, Tsukuba (JP); Tooru Takahashi, Tsukuba (JP); Hiroaki Kikuchi, Tsukuba (JP); Shigeyuki Yagi, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/860,773

(22) Filed: Jun. 4, 2004

(65) Prior Publication Data

US 2004/0218883 A1 Nov. 4, 2004

Related U.S. Application Data

(63) Continuation of application No. PCT/JP02/12763, filed on Dec. 5, 2002.

(30) Foreign Application Priority Data

Dec. 6, 2001 (JP) .............................. 2001-372563

(51) Int. Cl.
*H01L 21/00* (2006.01)
(52) U.S. Cl. .......................................... 438/33; 438/22
(58) Field of Classification Search .................. 438/22, 438/31, 33, 42–43; 382/14, 129–132; 264/1.24–1.29; 65/385; 83/39, 42–45, 49
See application file for complete search history.

(56) References Cited

U.S. PATENT DOCUMENTS

| | | | | |
|---|---|---|---|---|
| 5,266,528 | A * | 11/1993 | Yamada ......................... | 83/49 |
| 6,281,047 | B1 * | 8/2001 | Wu et al. ..................... | 438/113 |
| 6,291,317 | B1 * | 9/2001 | Salatino et al. ............. | 438/462 |
| 6,303,978 | B1 * | 10/2001 | Daniels et al. .............. | 257/642 |
| 6,317,326 | B1 * | 11/2001 | Vogel et al. ................. | 361/704 |
| 6,507,095 | B1 * | 1/2003 | Hashimoto ................... | 257/676 |
| 6,669,537 | B1 * | 12/2003 | Maeda et al. ................. | 451/41 |
| 6,737,678 | B1 * | 5/2004 | Kawakami et al. ........... | 257/79 |

FOREIGN PATENT DOCUMENTS

| | | |
|---|---|---|
| EP | 745654 A1 * | 12/1996 |
| EP | 0976802 A1 | 2/2000 |
| JP | 09293696 A | 11/1997 |
| JP | 11061065 A | 3/1999 |
| JP | 2000066051 A | 3/2000 |
| JP | 2000077361 A | 3/2000 |
| JP | 2001-127010 | 5/2001 |
| JP | 2001217211 A | 8/2001 |
| JP | 2001296438 A | 10/2001 |
| JP | 2002246338 A | 8/2002 |
| JP | 2003039327 A | 2/2003 |

OTHER PUBLICATIONS

Resin Bond Blades P1A Series Specification, Disco Corporatoin, Apr. 11, 2000.*
Dicing Tape Product Information, Toyo Adtec.*
International Search Report, completed Mar. 11, 2003.

* cited by examiner

*Primary Examiner*—Frank G. Font
*Assistant Examiner*—Ryan Lepisto
(74) *Attorney, Agent, or Firm*—Griffin & Szipl. P.C.

(57) ABSTRACT

A method for preparing an optical device by dicing includes applying a dicing tape onto the back face of a substrate provided thereon with a large number of optical elements on the surface thereof and dicing the substrate from the surface side of the substrate using a blade to thus prepare individual optical devices and the method is characterized in that the dicing operation is conducted in several stages using a blade which can ensure a moderate autogenously blade-generating effect. An optical device prepared by the method includes a substrate and an optical element formed on the surface of the substrate and it is characterized in that the maximum size of the ruptures present on the back face of the substrate in the direction vertical to the cut surface is not more than 0.1 mm.

20 Claims, No Drawings

METHOD FOR PREPARING OPTICAL DEVICE BY DICING

This is a continuation of International Patent Application No. PCT/JP02/12763 filed Dec. 5, 2002, which claims priority on Japanese Patent Application No. 200 1-372563, filed Dec. 6, 2001. The entire disclosures of the above patent applications are hereby incorporated by reference.

TECHNICAL FIELD OF THE INVENTION

The present invention relates to a method for the preparation of an optical device as well as an optical device and, in particular, to a method for the preparation of an optical device which is almost free of ruptures at the edge of the back face of its substrate and also free of the generation of any foreign substance as well as such an optical device.

BACKGROUND OF THE INVENTION

There has rapidly been increased requirements for the development of a large capacity-information transmission along with the recent wide spread of personal computers and the internet. For this reason, it has been desired for the spread of the optical transmission, which can ensure a high transmission rate, even to the terminal information transmission devices such as personal computers. To realize this, it is necessary to mass-produce high quality optical waveguides for use in the optical interconnection, at a low production cost.

As materials for preparing such an optical waveguide, there have been known, for instance, inorganic materials such as glass and semiconductor materials and various resins. When it is intended to prepare an optical waveguide using a resin, film-forming processes required can be conducted by coating and heating operations under the atmospheric pressure and accordingly, this method is quite advantageous in that devices and processes to be used are quite simple. Various kinds of resins have been known as those which permit the constitution of an optical waveguide and, in particular, polyimides have been expected as such materials because of their high glass transition points (Tg) and excellent heat resistance. When preparing an optical waveguide using a polyamide resin, the resulting waveguide may ensure long-term reliability and it can withstand the soldering.

An optical device prepared using a resin such as an optical waveguide is in general constructed by forming V-shaped grooves for mounting optical fibers on a substrate such as a silicon wafer and subsequently laminating, in order, a lower clad layer, a core layer and an upper clad layer of resins. For instance, a silicon wafer having a diameter of about 12.7 cm is prepared as a substrate; a large number of optical elements such as optical waveguides are lengthwise and crosswise formed and arranged on the substrate; a dicing tape is adhered to the back face of the same; and the silicon wafer is diced with a blade to thus separate the wafer into individual optical devices. Thus, desired optical waveguide devices can be mass-produced.

When applying a dicing tape onto the back face of the substrate and carrying out the dicing with a blade to thus separate optical devices by a single dicing operation or stage, however, a problem arises such that the substrate, in particular, the edge of the back face thereof is ruptured. In this connection, there has been proposed a method in which the upper resinous portion is cut using a relatively soft blade, while the lower substrate portion is cut using a relatively hard blade. However, this method suffers from such problems that it requires the use of two kinds of blades and that steps are formed at the cut area due to the use of such two kinds of blades. Furthermore, both of these methods suffer from a problem in that the substrate and, in particular, the edge of the back face thereof is ruptured when peeling off the dicing tape. The problem of such ruptures may further results in various other problems. For instance, the ruptures of the edge portion result in the lost of the flatness of the resulting optical device and the broken pieces of such edge portion serve as foreign substances and they adversely and variously affect the optical device.

DISCLOSURE OF THE INVENTION

Accordingly, it is an object of the present invention to provide a method for preparing an optical device, which can inhibit the formation of any rupture at the edges of the surface and back face of the substrate therefor during the dicing operation and which can thus inhibit the generation of foreign substances as low as possible.

It is another object of the present invention to provide an optical device almost free of any rupture at the edges of the surface and back face of the substrate therefor.

BRIEF SUMMARY OF THE INVENTION

According to the present invention, there are thus provided an optical device-production method and an optical device as will be specified below:

1. A method for producing individual optical devices by dicing, with a blade, a substrate which is provided with a large number of optical elements on the surface thereof, characterized in that the dicing operation is conducted in several stages using a blade which can ensure a moderate autogenously blade-generating effect.
2. A method for producing individual optical devices by dicing, with a blade, a substrate which comprises laminated resin layers and is provided with a large number of optical elements on the surface thereof, characterized in that the dicing operation is conducted in several stages and that the thickness of the blade used in the second and other stages subsequent thereto is thinner than that of the blade used in the stage just before that in question.
3. The method as set forth in the foregoing item 2, wherein the thickness of the blade used in the second and other steps subsequent thereto is thinner than that of the blade used in the stage just before that in question, by 0.05 to 0.5 µm.
4. The method as set forth in any one of the foregoing items 1 to 3, wherein the greater part of the resin layer is cut off during the first dicing stage.
5. The method as set forth in any one of the foregoing items 1 to 3, wherein the resin layer is completely cut off during the first dicing stage.
6. The method as set forth in any one of the foregoing items 1 to 3, wherein the whole resin layer and a part of the substrate are cut off during the first dicing stage.
7. A method for producing individual optical devices which comprises adhering a dicing tape to the back face of a substrate which is provided with a large number of optical elements on the surface thereof and dicing, with a blade, the substrate from the side of the surface thereof, the method being characterized in that the dicing operation is conducted in several stages using a blade which can ensure a moderate autogenously blade-generating effect.

8. The method as set forth in the foregoing item 7, wherein the dicing tape is one whose adhesive strength is reduced by the irradiation with UV light rays.
9. The method as set forth in the foregoing item 7 or 8, wherein the dicing tape has an adhesive strength against the substrate ranging from 3.0 to 10.0 N/20 mm during the cutting operation and the adhesive strength of not higher than 1.0 N/20 mm upon being peeled off from the substrate.
10. The method as set forth in any one of the foregoing items 1 to 9, wherein the blade having such a moderate autogenously blade-generating effect has an outer diameter of 2 inches (about 53 mm) and a blade thickness of 150 μm as well as an abrasion loss observed when a silicon wafer having a thickness of 1 mm is diced at 30,000 rpm and a feed rate of 5 mm/sec falling within the range of from 5 to 20 μm per unit dicing length of 1 m.
11. The method as set forth in any one of the foregoing items 1 to 10, wherein the blade having such a moderate autogenously blade-generating effect is one prepared from a metal resin bond or a resin bond.
12. The method as set forth in any one of the foregoing items 1 to 11, wherein the blade has an abrasive grain size ranging from 4 to 10 μm.
13. The method as set forth in any one of the foregoing items 1 to 12, wherein the dicing operation is conducted in two stages.
14. An optical device which comprises a substrate and an optical element formed on the surface of the substrate, the device being characterized in that the maximum size of the ruptures present on the back face of the substrate in the direction vertical to the cut surface is not more than 0.1 mm.
15. The optical device as set forth in the foregoing item 14, wherein the substrate is a silicon substrate.
16. The optical device as set forth in the foregoing item 15, wherein it is a polymeric optical waveguide device.

DETAILED DESCRIPTION AND BEST MODE FOR CARRYING OUT THE INVENTION

The optical device-production method of the present invention will hereunder be described in more detail, while taking, by way of example, a polymeric optical waveguide device according to an embodiment, but the present invention is not restricted to these specific embodiments at all.

Various kinds of substrates may be used in the present invention, but the most typical one is a silicon substrate.

A silicon dioxide layer is applied onto the upper surface of a substrate of silicon single crystal for the protection of the substrate and the control of the refractive index thereof and a polymeric optical waveguide in the form of a laminated body is formed on the silicon dioxide layer.

Moreover, any polymer materials may be used for the production of an optical waveguide (core and clad), but specific examples thereof include polyimide resins [such as polyimide resin, poly(imide-iso-indoloquinazoline-dione imide) resin, polyether imide resin, polyether ketone resin and polyester imide resin], silicone resins, acrylic resins, polystyrene resins, polycarbonate resins, polyamide resins, polyester resins, phenolic resins, poly(quinoline) resins, poly(quinoxaline) resins, poly(benzoxazole) resins, poly(benzothiazole) resins, poly(benzimidazole) resins, and resins for photo-bleaching (such as polysilane disclosed in Japanese Un-Examined Patent Publication (hereunder referred to as "J.P. KOKAI") 2001-296438, silicone resins containing nitroso compounds, poly(methyl methacrylate) containing DMAPN {(4-N,N-dimethylamino-phenyl)-N-phenyl nitron}, dye polymers, polyimide resins or epoxy resins containing nitroso compounds, and hydrolyzable silane compounds disclosed in J.P. KOKAI 2000-66051). The foregoing resins may be those containing fluorine atoms. Such polymers preferably used herein should have high glass transition points (Tg) and excellent heat resistance and therefore, preferred examples thereof are polyimide resins, with fluorinated polyimide resins being particularly preferred among others.

A typical polymeric optical waveguide laminated body has a structure comprising a silicon substrate, a silicon dioxide layer formed thereon, and a laminated body applied onto the silicon dioxide layer, which is formed by laminating a layer of an organic zirconium compound, a layer of a fluorine-free resin, a lower clad layer, a core layer, an upper clad layer in which the core layer is embedded and a protective layer in this order. All of the foregoing lower clad layer, the core layer and the upper clad layer are formed from fluorinated polyimide resins. The organic zirconium compound layer and the fluorine free resin layer are arranged for the improvement of the adhesion between the substrate and the lower clad layer.

After the formation of a large number of optical waveguides (for instance, 100 to 1000 waveguides) having a structure identical to that discussed above on the substrate, the substrate is cut into strips (tanzaku-like pieces) through dicing with a blade, these tanzaku-like pieces of the substrate are further cut into individual optical waveguide devices through dicing to thus complete each individual optical waveguide device.

The dicing method according to the present invention will further be described in detail below.

A first embodiment of the dicing method according to the present invention comprises dicing, with a blade, a substrate which is provided with a large number of optical elements on the surface thereof and it is characterized in that the dicing operation is conducted in several stages using the blade which can ensure a moderate autogenously blade-generating effect.

A second embodiment of the present invention comprises dicing, with a blade, a substrate which comprises laminated resin layers and is provided with a large number of optical elements on the surface thereof, and it is characterized in that the dicing operation is conducted in several stages and that the thickness of the blade used in the second and other stages subsequent thereto is thinner than that of the blade used in the stage just before that in question.

A third embodiment of the present invention comprises adhering a dicing tape to the back face of a substrate which is provided with a large number of optical elements on the surface thereof and dicing, with a blade, the substrate from the side of the surface thereof and the method is characterized in that the dicing operation is conducted in several stages using the blade which can ensure a moderate autogenously blade-generating effect.

In case where the substrate is fixed by applying a dicing tape to the back face of the substrate as has been described above in connection with the third embodiment or by applying a wax, the substrate can completely be cut off in the second or subsequent dicing stage. However, in case where any dicing tape or the like is not used, the substrate is first half-cut and thereafter the substrate is folded along the half-cut portion to thus separate the substrate into individual optical devices.

An advantage described below in detail will be obtained by carrying out the dicing operation in a plurality of stages:

Only the resin layer is almost completely cut in the first dicing stage and the core edge faces are simultaneously polished with the blade's abrasive grains and the substrate (such as a silicon substrate) is then cut off in the second and/or subsequent stages. In this connection, the edge portion of the blade is already worn away during the first dicing operation and the blade thickness is therefore reduced and the blade is not brought into contact with the faces processed during the first dicing operation. Accordingly, the first processed faces are not further polished and therefore, the polishing precision is improved. For this reason, the dicing operation is desirably carried out using a blade which can ensure a moderate autogenously blade-generating effect, even in the second embodiment, provided that it is also possible to carry out the dicing operation using a blade free of any moderate autogenously blade-generating effect such as a blade provided with electrodeposited diamond layer in the second embodiment.

It is quite important when the dicing operation is carried out in a plurality of stages that the thickness of the blade used in the second and subsequent stages is thinner than that used in the stage immediately before that in question as has been described in the second embodiment. For this reason, the blades used in the second and subsequent stages never come in contact with the cut surfaces formed by the dicing operation immediately before that in question, the smoothness of the polished face thus formed during the dicing operation is maintained and the dicing efficiency is accordingly improved.

The thickness of the blade used in the second and subsequent stages is desirably thinner than that of the blade used in the dicing stage immediately before that in question, by preferably 0.05 to 0.5 µm and more preferably 0.1 to 0.3 µm.

When the dicing operation is carried out in a plurality of stages, the greater part of the resin layer may be cut in the direction of its thickness in the first dicing stage; the resin layer may completely be cut in the direction of its thickness in the first dicing stage; or the whole resin layer and a part of the substrate may be cut in the direction of its thickness in the first dicing stage.

A resin layer having a thickness of not more than 100 µm may in general be cut by a single dicing operation, but it would sometimes be preferred that a substrate usually thicker than the resin layer is cut in a plurality of dicing stages depending on the thickness of the substrate.

In the third embodiment of the present invention, a dicing tape is first adhered to the back face of the substrate provided with a large number of optical elements formed thereon. In this connection, the substrate is completely cut and separated by the dicing operation, but the dicing tape is not cut and separated into pieces and it is slightly or partially cut at the boundary region between the substrate and the tape. The tape is used for preventing any damage of the blade due to, for instance, the scattering of cut off pieces of the optical waveguide substrate and for making the handling thereof after cutting easy.

Various kinds of dicing tapes may be used in the present invention, but preferably used herein are those having an adhesion to the substrate upon cutting, for instance, on the order of about 3.0 to 10.0 N/20 mm. If the adhesion is lower than 3.0 N/20 mm, the substrate is not firmly fixed and the number of ruptures formed at the edge of the resulting optical device increases, while if it exceeds 10.0 N/20 mm, air bubbles come into the boundary between the substrate and the tape because of the difficulty in the handling thereof upon the application thereof onto the substrate and the number of ruptures formed at the edge of the resulting optical device likewise increases in this case.

On the other hand, it is preferred to use a dicing tape having an adhesion strength, upon peeling off, of not more than 1.0 N/20 mm. This is because, if the adhesion strength thereof is too high, it is difficult to peel off the same from the optical devices and if the tape is forcibly peeled off, the number of ruptures formed at the edge of the resulting optical device increases. In addition, the dicing tape may be one prepared from a hard material in order to firmly fix the substrate. In case where it is too hard, however, the tape is not extended when peeling off the optical waveguide substrate and this in turn makes the peeling off of the same difficult.

From the foregoing viewpoints, the dicing tape particularly preferably used in the present invention is one whose adhesion strength is high prior to the irradiation of UV light rays, while it is considerably reduced by the irradiation with UV light rays. Specific examples of such dicing tapes include UHP-1005M3 (polyolefin type ones) available from Toyo Chemical Co., Ltd. or the like.

The blade used in the dicing operation of the present invention is one having a moderate autogenously blade-generating effect. In this respect, the term "blade having moderate autogenously blade-generating effect" used herein means one having an abrasion loss, of not less than 5 µm per unit dicing length of 1 m, observed when a silicon wafer having a thickness of 1 mm is diced at a rotational speed of 30,000 rpm and a feed rate of 5 mm/sec, using a blade having an outer diameter of 2 inches (about 53 mm) and a blade thickness of 150 µm and those having moderate autogenously blade-generating effects corresponding to that specified above.

In the method of the present invention, a blade having a high autogenously blade-generating effect is rather preferably used since the number of ruptures observed at the edge of the resulting optical device, but if the autogenously blade-generating effect is too high, problems arise such that the abrasion loss of the blade is extremely high and the blade should correspondingly be exchanged frequently. For this reason, it is desirable to use a blade whose autogenously blade-generating effect preferably ranges from 5 to 20 µm and more preferably 5 to 10 µm as expressed in terms of the abrasion loss. Specific examples of such blade having preferred autogenously blade-generating effects include those prepared from metal resin bonds and resin bonds, with those prepared from metal resin bonds being most preferred. Commercially available ones include, for instance, P1A8 type ones available from Disco Company.

In this connection, the greater the size of the abrasive grains constituting the blade, the higher the cutting force of the blade. The abrasive grain size of the blade used in the present invention preferably ranges from about 4 to 10 µm.

The present invention is characterized in that the dicing operation is conducted in several stages. The use of an increased number of dicing stages would permit the formation of smooth cut surfaces and the number of ruptures formed at the edge of the resulting optical device can be reduced, but the processing time increases in proportion to the number of dicing stages. Accordingly, it is in general preferred to divide the dicing operation into two stages. For instance, the resin layer (having a thickness of about 200 µm) is cut in the first dicing stage and the substrate layer (having a thickness of about 800 µm) is then cut in the second dicing stage.

Other dicing conditions are the same as those commonly used and blade-cooling water and showering water are fed at rates of 1.0 to 2.0 L/min and 0.5 to 2.0 L/min, respectively during the dicing operation. The thickness of the blade ranges from about 50 to 200 μm; the working rate ranges from about 2 to 30 mm/sec and more preferably 5 to 20 mm/sec; and the rotational number of blade suitably ranges from about 30000 to 40000 rpm for a blade having a diameter of 2 inches.

According to the present invention, there is further provided an optical device which comprises a substrate provided thereon with an optical element and which is characterized in that the maximum size of ruptures present on the back face of the substrate in the direction vertical to the cut surface or ruptures at the edge of the back face of the substrate is not more than 0.1 mm and preferably not more than 0.05 mm.

Such an optical device can easily be produced by the application of the dicing method of the present invention. In this connection, the maximum size of ruptures present on the back face of the substrate in the direction vertical to the cut surface or ruptures at the edge of the back face of the substrate can be controlled to a level on the order of not more than 0.05 mm. It is desirable that the maximum size of ruptures present on the back face of the substrate in the direction vertical to the cut surface or ruptures at the edge of the back face of the substrate be not more than 0.05 mm and preferably not more than 0.03 mm.

Further, in the optical device of the present invention, the total area of the ruptures formed on the back face of the substrate is preferably not more than 5%, more preferably not more than 3% and particularly preferably not more than 1%.

Incidentally, the term "optical device" used in the present invention means one which comprises a substrate, for instance, an inorganic material such as glass or quartz, a semiconductor such as silicon, gallium arsenide, aluminum or titanium, a metallic material, a polymeric material such as polyimide or polyamide, or a composite material comprising any combination of the foregoing materials; and an optical element, formed on the substrate, such as an optical waveguide, an optical multiplexer, an optical demultiplexer, an optical attenuator, a light-diffraction device, an optical amplifier, a light-interference device, an optical filter, an optical switch, a wavelength converter, a light-emitting element, a light-receiving element or a composite device comprising any combination of these elements. A semiconductor device such as a light-emitting diode or a photodiode and a metal film may sometimes formed on the foregoing substrate and a silicon dioxide film may be applied onto the substrate or a silicon nitride, aluminum oxide, aluminum nitride or tantalum oxide film may be formed on the substrate for the protection of the substrate and/or the adjustment of the refractive index thereof.

EXAMPLE AND COMPARATIVE EXAMPLE

A large number of polyimide optical waveguides (20 to 30 μm in thickness) were formed on a silicon wafer having a diameter of 12.7 cm and a thickness of about 1 mm. More specifically, a layer of an organic zirconium compound (about 100 Å in film thickness) was first applied onto the surface of the substrate and then a layer of a first polyimide resin free of any fluorine atom (about 0.23 μm in thickness) was formed thereon. Further, there were in order applied, onto the substrate, a lower clad layer consisting of a second polyimide resin film (about 6 μm in thickness), a core layer consisting of a third polyimide resin film (about 6.5 μm in thickness), an upper clad layer (having a thickness of about 10 μm in the area immediately above the core layer and about 5 μm in the other area) consisting of the second polyimide resin film and a protective layer consisting of a forth polyimide resin film (having a thickness of about 5 μm at the edge portion located far away from the core).

A dicing tape was adhered to the back face of the substrate and the substrate was cut into individual optical waveguide devices by dicing to thus complete the optical waveguide devices. The conditions used in this dicing operation are summarized in the following Table 1. The cutting width during the dicing was set at 150 μm and the size of each optical waveguide device was 1.5 mm×8.0 mm.

TABLE 1

|  | Example | Comp. Ex. |
|---|---|---|
| Dicing tape | UV-irradiation peeled off type | Usual peeled off type |
| Total thickness | 0.105 mm | 0.08 mm |
| Adhesive force | 4.5 N/20 mm (0.5 N/20 mm after irradiation with UV light) | 0.8 N/20 mm |
| Material | Polyolefin | Polyvinyl chloride |
| Blade used | Metal resin bond | Metal bond |
| Abrasion loss of blade | About 0.09 mm/wafer | Not more than detection limit/wafer |
| Abrasive gain size | 4 to 8 μm | 0.5 to 3 μm |
| Peeling of resin[1] | 0.03 mm | 0.03 mm |
| Rupture: Max. size[2] | 0.1 mm | 0.3 mm |
| Overall area[3] | Not more than 1% | 10% |
| Cutting method | Cutting in two stages | Cutting in one stage |
| Amt. of cutting water |  |  |
| Blade cooler | 1.5 L/min | 1.0 L/min |
| Shower | 1.0 L/min | 1.0 L/min |

[1]Peeling of the resin: The maximum size of the resin peeled off in the direction vertical to the cut surface on the substrate.
[2]Maximum size of the rupture: The maximum size of the ruptures present on the back face of the substrate in the direction vertical to the cut surface.
[3]Overall area of the ruptures: The total area of the ruptures formed on the back face of the substrate.

INDUSTRIAL APPLICABILITY

According to the present invention, in the method which comprises the steps of applying a dicing tape onto the back face of a substrate provided thereon with a large number of optical elements on the surface thereof and dicing the substrate from the surface side of the substrate using a blade to thus prepare individual optical devices, the dicing operation is conducted in several stages using a blade which can ensure a moderate autogenously blade-generating effect. Accordingly, the number of ruptures observed at the edge of the back face of the substrate is considerably reduced and there is observed only a trace amount of foreign substances. At this stage, if a tape whose adhesive force is reduced upon irradiation with UV light rays and which can easily be peeled off is used as such a dicing tape, the probability of generating ruptures may further be reduced and the size (the total area of the ruptures) may likewise considerably be reduced.

In addition, the optical device of the present invention has only a small number of ruptures at the edge portion thereof and it is free of any step originated from the cutting operation on the cut surface and accordingly it is excellent in the flatness since it is prepared by dicing with a single or the same blade.

What is claimed is:

1. A method for producing individual optical devices, the method comprising the steps of:
   providing a substrate on which laminated resin layers are provided and providing the substrate with a large number of optical elements on the surface thereof; and
   conducting a dicing operation in a plurality of stages using a blade to ensure a moderate autogenously blade-generating effect.

2. The method of claim 1, wherein thickness of the blade in a second or subsequent step is thinner than a thickness of the blade in a first or prior step.

3. The method of claim 2, wherein the thickness of the blade used in the second and other stages subsequent thereto is thinner than the thickness of the blade used in the stage just before the stage in question, by 0.05 to 0.5 μm.

4. The method as set forth in claim 1, wherein the greater part of the resin layers is cut off during the first dicing stage.

5. The method as set forth in claim 1, wherein the resin layers are completely cut off during the first dicing stage.

6. The method as set forth in claim 1, wherein each resin layer and a part of the substrate are cut off during the first dicing stage.

7. The method of claim 1, wherein the blade having such a moderate autogenously blade-generating effect has an outer diameter of about 53 mm and a blade thickness of 150μm as well as an abrasion loss observed when a silicon wafer having a thickness of 1 mm is diced at 30,000 rpm and a feed rate of 5 mm/sec falling within the range of from 5 to 20 μm per unit dicing length of 1 m.

8. The method as set forth in claim 1, wherein the blade having such a moderate autogenously blade-generating effect is one prepared from a metal resin bond or a resin bond.

9. The method as set forth in claim 1, wherein the blade has an abrasive grain size ranging from 4 to 10 μm.

10. The method as set forth in claim 1, wherein the dicing operation is conducted in two stages.

11. A method for producing individual optical devices, comprising the steps of:
    adhering a dicing tape to a back face of a substrate on which laminated resin layers are provided and that is provided with a large number of optical elements on the surface thereof; and
    dicing, with a blade, the substrate from the side of the surface thereof, wherein dicing is conducted in a plurality of stages using a blade to ensure a moderate autogenously blade-generating effect.

12. The method of claim 11, wherein the dicing tape is one whose adhesive strength is reduced by irradiation with UV light rays.

13. The method of claim 11, wherein the dicing tape has an adhesive strength with respect to the substrate ranging from 3.0 to 10.0 N/20 mm during cutting and the adhesive strength of not higher than 1.0 N/20 mm upon being peeled off from the substrate.

14. The method as set forth in claim 11, wherein the blade having such a moderate autogenously blade-generating effect has an outer diameter of about 53 mm and a blade thickness of 150 μm as well as an abrasion loss observed when a silicon wafer having a thickness of 1 mm is diced at 30,000 rpm and a feed rate of 5 mm/sec falling within the range of from 5 to 20 μm per unit dicing length of 1 m.

15. The method as set forth in claim 11, wherein the blade having such a moderate autogenously blade-generating effect is one prepared from a metal resin bond or a resin bond.

16. The method as set forth in claim 11, wherein the blade has an abrasive grain size ranging from 4 to 10 μm.

17. The method as set forth in claim 11, wherein the dicing operation is conducted in two stages.

18. A method for producing individual optical devices, the method comprising the steps of:
    (a) providing a substrate on which laminated resin layers are provided and providing the substrate with a number of optical elements on a surface of the substrate; and
    (b) conducting a dicing operation in stages using a blade, wherein the dicing operation includes the steps of
        (i) conducting a first dicing stage using a blade having a first thickness to almost completely cut the resin layers; and
        (ii) conducting a second dicing stage using the blade to completely cut the resin layers and the substrate, wherein the blade in this step (ii) has a second thickness thinner than the first thickness of the blade in step (i).

19. The method of claim 18, wherein in the first dicing stage, abrasive grains of the blade polish core edge faces during cutting.

20. The method of claim 19, wherein during the first dicing stage, an edge portion of the blade is worn away and the thickness of the blade is reduced from the first thickness to the second thickness.

* * * * *